US012026791B2

United States Patent
He et al.

(10) Patent No.: US 12,026,791 B2
(45) Date of Patent: Jul. 2, 2024

(54) METHOD, SYSTEM, COMPUTER EQUIPMENT AND MEDIUM FOR ESTIMATING NITROGEN APPLICATION AMOUNT IN DISTRIBUTIVE REGIONS

(71) Applicant: Institute of Eco-environmental and Soil Sciences, Guangdong Academy of Sciences, Guangzhou (CN)

(72) Inventors: Bin He, Guangzhou (CN); Qixiu Li, Guangzhou (CN)

(73) Assignee: INSTITUTE OF ECO-ENVIRONMENTAL AND SOIL SCIENCES, GUANGDONG ACADEMY OF SCIENCES, Guangzhou (CN)

( * ) Notice: Subject to any disclaimer, the term of this patent is extended or adjusted under 35 U.S.C. 154(b) by 0 days.

(21) Appl. No.: 18/321,642

(22) Filed: May 22, 2023

(65) Prior Publication Data
US 2023/0385960 A1    Nov. 30, 2023

(30) Foreign Application Priority Data
May 25, 2022    (CN) .......................... 202210572674.3

(51) Int. Cl.
*G06Q 50/02* (2024.01)
*G06F 30/20* (2020.01)

(52) U.S. Cl.
CPC ............. *G06Q 50/02* (2013.01); *G06F 30/20* (2020.01)

(58) Field of Classification Search
None
See application file for complete search history.

(56) References Cited

U.S. PATENT DOCUMENTS

2016/0180473 A1    6/2016   Groeneveld

FOREIGN PATENT DOCUMENTS

| CN | 103106347 A | 5/2013 |
| CN | 103646347 A | 3/2014 |

(Continued)

OTHER PUBLICATIONS

Trevisan, et al.("Spatial variability of crop responses to agronomic inputs in on-farm precision experimentation." Precision Agric 22, 342-363 (2021 (Year: 2021).*

(Continued)

*Primary Examiner* — Roy Y Yi

(57) ABSTRACT

A method disclosed includes following steps: gridding on a research area to obtain grid units; performing a numerical processing on fertilization influence features to obtain fertilization influence numerical features of each grid unit; acquiring time information of the fertilization manual in the research area; calculating the fertilization influence numerical features of each grid unit by using weights of the fertilization influence features, acquiring nitrogen fertilizer application amounts of each grid unit in different time periods; performing a data processing on a first geographic information system to obtain a second geographic information system; and using the second geographic information system to estimate a nitrogen fertilizer application amount in the research area. A system disclosed includes a gridding unit, a digitizing unit, an acquisition unit, a calculation unit, a data processing unit and a nitrogen fertilizer estimation unit. a computer equipment disclosed includes a processor and a memory for storing executable programs.

5 Claims, 5 Drawing Sheets

(56) References Cited

FOREIGN PATENT DOCUMENTS

| | | |
|---|---|---|
| CN | 104871704 A | 9/2015 |
| CN | 109168521 A | 1/2019 |
| CN | 109392395 A | 3/2019 |
| CN | 111413484 A | 7/2020 |
| CN | 112598277 A | 4/2021 |
| CN | 114219227 A | 3/2022 |
| CN | 114402780 A | 4/2022 |
| FR | 3007556 A1 | 12/2014 |

OTHER PUBLICATIONS

Trevsian (Year: 2021).*
Chinese Doctoral Dissertations—Engineering Science and Technology I: "Effects of Intensity of Human Activities on Water Quality of River of Karst Damming Based on the Spatial Quantitative Model" 2021.

\* cited by examiner

FIG. 2

METHOD, SYSTEM, COMPUTER EQUIPMENT AND MEDIUM FOR ESTIMATING NITROGEN APPLICATION AMOUNT IN DISTRIBUTIVE REGIONS

CROSS-REFERENCE TO RELATED APPLICATIONS

This application claims priority to Chinese Patent Application No. 202210572674.3, filed on May 25, 2022, the contents of which are hereby incorporated by reference.

TECHNICAL FIELD

The application relates to a method, a system, a computer equipment and a medium for estimating a nitrogen application amount in distributive regions, and belongs to a technical field of planting statistics.

BACKGROUND

Nitrogen fertilizer application amount is an indispensable input data in calculating non-point source pollution of watershed. At present, the method used is a zone equipartition method. Specifically, the nitrogen fertilizer amounts with different nitrogen contents are counted according to administrative divisions, and then evenly distributed according to GIS grid points. The grids in each administrative division get a same nitrogen fertilizer application amount as the nitrogen fertilizer application amount of each grid.

The zone equipartition method ignores that the nitrogen fertilizer application amount is a continuous spatio-temporal variant, and the use of the same nitrogen fertilizer amount in the same administrative region may not reflect a comprehensive spatio-temporal distribution of nitrogen fertilizer in a region. Therefore, to accurately estimate the nitrogen fertilizer application amount, it is necessary to consider specificities of nitrogen fertilizer application in time and space, as well as an influence of human factors on nitrogen fertilizer application. Specifically, in terms of space, on the one hand, it is necessary to consider influences of different landforms, different land types, different climatic conditions and different crops on the nitrogen fertilizer application, on the other hand, it is necessary to consider differences in the nitrogen fertilizer application caused by using different fertilization manuals in different administrative regions; in terms of time, there are differences in fertilization operations and use efficiencies of nitrogen fertilizer in different time periods, and the fertilization manual in each administrative area is also different in terms of time. When calculating the nitrogen fertilizer application amount, it is necessary to consider the specificities of the nitrogen fertilizer application in terms of time. In the aspect of human factors, in the traditional agriculture in China, the spatio-temporal variability of the soil is often not taken into account and the fertilization is carried out grounded on experiences, which lacks pertinence, resulting in a low fertilizer utilization rate, a crop quality difficult to improve, and air and water pollutions.

Therefore, it is of great significance to study the spatio-temporal variation law of the soil fertilization amount, divide soil fertilization amount and nutrient management units, and adjust the input amount of fertilizers and other substances accordingly, it is of great significance to accurately monitor and quantify the nitrogen fertilization amount in the watershed, simulate nitrogen pollutions in soil and water bodies, improve a fertilizer utilization rate, increase the income of farmers and protect the ecological environment, etc.

SUMMARY

In view of the above, the application provides a method, a system, a computer equipment and a medium for estimating a nitrogen application amount in distributive regions, the application estimates the nitrogen fertilizer application amount in different spaces by carrying out a numerical processing on fertilization influence features of each of the grid units, and calculating the numerical fertilization influence features by using each feature weights; in addition, the application also considers a time specificity of the nitrogen fertilizer application, calculates the nitrogen fertilizer application amounts of the same grid unit in different time periods according to time information of a fertilizer application manual in a research area, inputs the nitrogen fertilizer application amount of the grid units in each different administrative region in different time periods into a geographic information system (GIS), and reflects time and space distributions of the regional nitrogen fertilizer application amount by using the GIS, so as to provide a scientific basis for a fine management of soil fertilization.

A first objective of the application is to provide a method for estimating a nitrogen application amount in distributive regions.

A second objective of the application is to provide a system for estimating a nitrogen application amount in distributive regions.

A third objective of the application is to provide a computer equipment.

A fourth objective of the application is to provide a storage medium.

The first objective of the application may be achieved by adopting a following technical scheme:

a method for estimating a nitrogen application amount in distributive regions includes following steps:

carrying out a gridding processing on a research area to obtain a plurality of grid units;

carrying out a numerical processing on fertilization influence features of each of the grid units to obtain fertilization influence numerical features of the each of the grid units, the fertilization influence numerical features comprise crop types, land use types, topographic factors, crop harvesting times, crop fertilization total amounts and crop fertilization times;

acquiring time information of a fertilization manual in the research area;

calculating the fertilization influence numerical features of the each of the grid units by using weights of the fertilization influence features according to the time information of the fertilization manual in the research area, and acquiring the nitrogen fertilizer application amounts of the each of the grid units in different time periods;

performing a data processing on a first geographic information system to obtain a second geographic information system according to the nitrogen fertilizer application amounts of the each of the grid units in the different time periods; and using the second geographic information system to estimate the nitrogen fertilizer application amount in the research area.

Further, the carrying out the numerical processing on the fertilization influence features of the each of the grid units specifically includes:
  carrying out the numerical processing on the crop types of the each of the grid units; and
  carrying out the numerical processing on the crop harvesting times, the crop fertilization total amounts and the crop fertilization times in the each of the grid units.

Further, the carrying out the numerical processing on the crop types of the each of the grid units specifically includes:
  establishing a block containing only one crop representation type in the each of the grid units, and using blocks containing different crop representation types of the plurality of grid units to represent the crops planted in the each of the grid units; and
  establishing a mapping relationship between the crops planted in the each of the grid units and constants, and completing the numerical processing on the crop types; and
  establishing an m×n matrix by using an R language for an area containing m counties, in which the county with the most planting areas has n planting areas when making a regional fertilization electronic manual according to the mapping relationship between the crops planted in the each of the grid units and the constants, wherein a matrix element $x_{i,j}$ represents a j-th planting area of an i-th county, and a numerical value $C_x$ of $x_{i,j}$ represents a crop type of the area.

Further, the carrying out the numerical processing on the crop harvesting times, the crop fertilization total amounts and the crop fertilization times in the each of the grid units specifically includes:
  collecting fertilization manuals of different administrative regions, sorting out a numerical template that integrates the crop harvesting times, the total crop fertilization amounts and the crop fertilization times; and
  by consulting the numerical template, acquiring the numerical features of the crop harvesting time, the total crop fertilization amount and the crop fertilization time of the each of the grid units.

Further, calculating the fertilization influence numerical features of the each of the grid units by using weights of the fertilization influence features, and the calculation formulas are as follows:

$$N_{UNIT} = N_{TA}(\omega_1 x_1 + \omega_2 x_2 + \ldots + \omega_i x_i) C_j$$

$$N_{AMM} = N_{TA}(\varepsilon_1 x_1 + \varepsilon_2 x_2 + \ldots + \varepsilon_i x_i) C_j$$

$$N_{NIT} = N_{TA}(\gamma_1 x_1 + \gamma_2 x_2 + \ldots + \gamma_i x_i) C_j;$$

where $N_{UNIT}$ represents the nitrogen fertilizer application amount in the grid unit; $N_{AMM}$ represents an ammonia nitrogen amount in the grid unit; $N_{NIT}$ represents a nitrate nitrogen amount in the grid unit; $N_{TA}$ represents a total fertilizer application; $(x_1, x_2, \ldots, x_i)$ represents a set of digital features representing the land use types, the topographic factors, the fertilization times and other factors; $\omega$, $\varepsilon$, $\gamma$ represents weights of each feature; and $C_j$ represents a constant corresponding to the crop type in a cell.

Further, performing the data processing on the first geographic information system to obtain the second geographic information system according to the nitrogen fertilizer application amounts of the each of the grid units in the different time periods specifically as follows:
  numbering the each of the grid units to obtain a numerical number of the each of the grid units;
  carrying out a one-to-one correspondence between the nitrogen fertilizer application amounts of the each of the grid units in the different time periods and the numerical numbers of the each of the grid units where the nitrogen fertilizer application amount is located to obtain electronic data of the fertilization manual; and
  inputting the electronic data of the fertilization manual into the first geographic information system to obtain the second geographic information system.

Further, the electronic data of the fertilization manual comprises the numerical numbers of the grid units, administrative area information and time information, wherein the numerical numbers of the grid units represents the fertilization times and the nitrogen fertilizer application amounts of the grid units.

The second objective of the application may be achieved by adopting a following technical scheme:
  a system for estimating a nitrogen application amount in distributive regions, including:
  a gridding unit used for carrying out the gridding processing on the research area to obtain a plurality of grid units;
  a digitizing unit used for carrying out a numerical processing on fertilization influence features of each of the grid units to obtain fertilization influence numerical features of the each of the grid units, the fertilization influence features include the crop types, the land use types, the topographic factors, the crop harvesting times, the crop fertilization total amounts and the crop fertilization times;
  an acquisition unit used for acquiring the time information of the fertilization manual in the research area;
  a calculation unit used for calculating the fertilization influence numerical features of the each of the grid units by using weights of the fertilization influence features according to the time information of the fertilization manual in the research area, and acquiring the nitrogen fertilizer application amounts of the each of the grid units in different time periods;
  a data processing unit used for performing a data processing on a first geographic information system to obtain a second geographic information system according to the nitrogen fertilizer application amounts of the each of the grid units in the different time periods; and
  a nitrogen fertilizer estimation unit used for using the second geographic information system to estimate a nitrogen fertilizer application amount in the research area.

The third objective of the application may be achieved by adopting a following technical scheme:
  a computer equipment, including a processor and a memory for storing a program executable by the processor; when the processor executes the program stored in the memory, the above-mentioned method for estimating a nitrogen application amount in distributive regions is realized.

The fourth objective of the application may be achieved by adopting a following technical scheme:
  a storage medium storing a program, when the program is executed by the processor, the above-mentioned method for estimating a nitrogen application amount in distributive regions is realized.

Compared with the prior art, the application has following beneficial effects:
  First, by carrying out the numerical processing on the fertilization influence features, and at the same time, by using the feature weights to calculate the numerical fertilization influence features, the application realizes a regional nitrogen application amount estimation, and makes the evaluation result of regional nitrogen fertilizer application amount more reliable.

Second, the application establishes a distribution system of the nitrogen fertilization amounts in the grid units based on the fertilization manuals of the different administrative regions, reflects comprehensively the time and space distributions of the regional nitrogen fertilizer application amounts, and provides the scientific basis for fine management of soil fertilization.

BRIEF DESCRIPTION OF THE DRAWINGS

In order to explain embodiments of the application or the technical scheme in the prior art more clearly, the drawings needed to be used in the description of the embodiments or the prior art are briefly introduced below. Obviously, the drawings in the following description are only some embodiments of the application, and other drawings may be obtained according to the structures shown in these drawings without creative work for ordinary people in the field.

Figure 2:
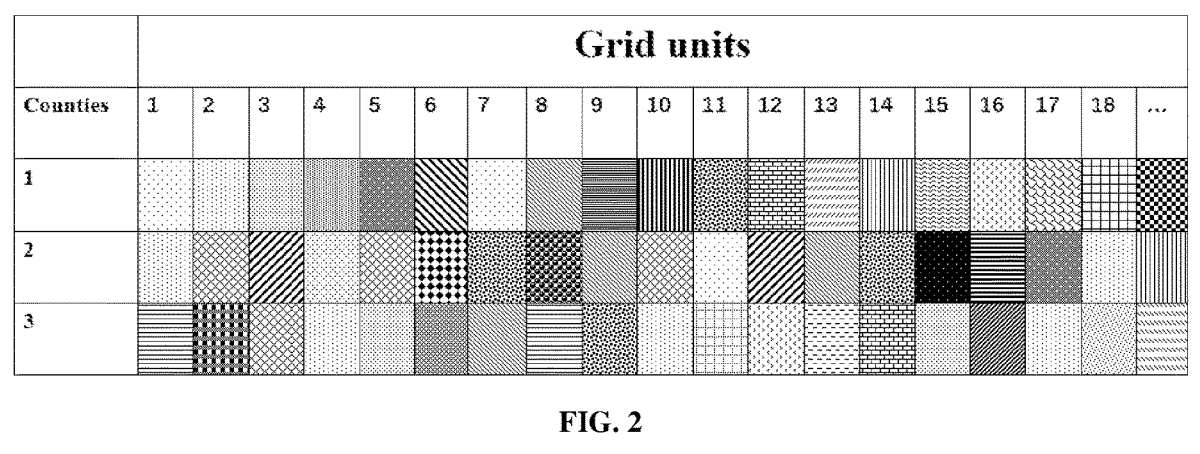

FIG. 2 is a diagram of different crop types established based on grid units according to Embodiment 1 of the application.

DETAILED DESCRIPTION

In order to make the objectives, technical schemes and advantages of embodiments of the application clearer, the technical schemes in the embodiments of the application are described clearly and completely with the attached drawings. Obviously, the described embodiments are a part of the embodiments of the application, but not the whole embodiments. Based on the embodiment of the application, all other embodiments obtained by ordinary technicians in the field without creative labor belong to the scope of protection of the application.

Embodiment 1

Figure 1:
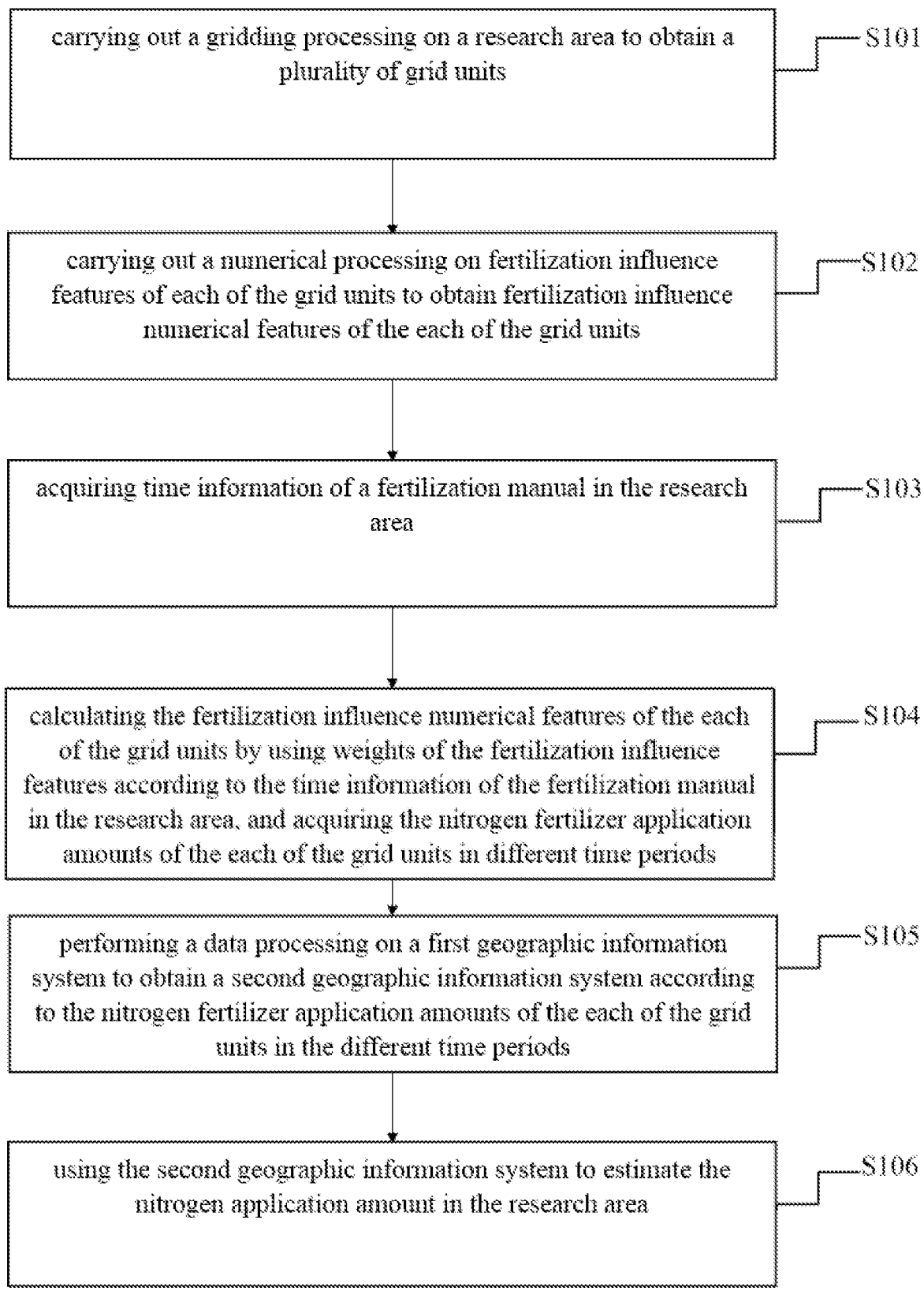
FIG. 1 is a flowchart of a method for estimating a nitrogen application amount in distributive regions according to Embodiment 1 of the application.
Figure 3:
FIG. 3 is a mapping relationship diagram between crop types and constants according to Embodiment 1 of the application.

As shown in FIG. 1, this embodiment provides a method for estimating a nitrogen application amount in distributive regions, including the following steps:

S101, carrying out a gridding processing on a research area to obtain a plurality of grid units;

different administrative regions have diversified fertilization influence features due to different geographical features, climates and management methods, the diversified fertilization influence features are conducive for research. Therefore, this embodiment selects a number of different administrative regions as research areas, and at the same time uses ArcGIS to grid the different administrative regions to obtain a plurality of grid units.

The fertilization influence features in this embodiment specifically include crop types, land use types, topographic factors, crop harvesting times, crop fertilization total amounts and crop fertilization times.

S102, carrying out a numerical processing on fertilization influence features of each of the grid units to obtain fertilization influence numerical features of the each of the grid units.

(1) Carrying out the numerical processing on the crop types of the each of the grid units.

The crop types are important features in calculating the nitrogen fertilizer application amount. Therefore, in this embodiment, before calculating the nitrogen fertilizer application amount, several typical crop types are given specific values and digitally characterized, specifically as follows:

as shown in FIG. 2, establishing representation types in the each of the grid units, each block only contains one representation type, each block represents a crop type, and the representation type of the each of the grid units represents a crops planted in this grid unit; establishing an m×n matrix by using an R language for an area containing m counties, in which the county with the most planting areas has n planting areas when making a regional fertilization electronic manual according to the mapping relationship between the crops planted in the each of the grid units and the constants, wherein a matrix element $x_{i,j}$ represents a j-th planting area of an i-th county, and a numerical value $C_x$ of $x_{i,j}$ represents a crop type of the area.

In the embodiment, the crop types are numerically characterized, so that each cell has a numerical feature representing the crop type.

(2) Carrying out the numerical processing on the crop harvesting times, the crop fertilization total amounts and the crop fertilization times.

The crop fertilization total amounts and the crop fertilization times are different in different administrative regions, and the crop harvesting times are also different. Therefore, collecting fertilization manuals in different administrative regions, and sorting out a numerical template that integrates the crop harvesting times, the total crop fertilization amounts and the crop fertilization times, as shown in Table 1.

TABLE 1

Numerical template of the crop harvesting times, the crop fertilization total amounts and the crop fertilization time

| County/district | Crop fertilization manuals (unit: kg/10 a) | | | | Crop harvesting times |
|---|---|---|---|---|---|
| | The first time | The second time | The third time | The fourth time | |
| County 1 | 6.0 (Early May) | 2.0 (Mid-July) | 2.0 (Early July) | — | October |

TABLE 1-continued

Numerical template of the crop harvesting times, the crop fertilization total amounts and the crop fertilization time

| County/district | Crop fertilization manuals (unit: kg/10 a) | | | | Crop harvesting times |
|---|---|---|---|---|---|
| | The first time | The second time | The third time | The fourth time | |
| County 2 | 4.9 (Late April to early May) | 2.8 (Late June to early July) | — | — | Early September to late October |
| County 3 | 3.2 (Late May to early June) | 2.3 (Mid-June to late July) | — | — | Late September to mid-October |
| District 1 | 8.0 (Early May) | 0.7 (Late May to early June) | 1.5 (Early July to mid-July) | 2.0 (Mid-July to late July) | Early October to late October |
| District 2 | 4.0 (Early March to early May) | 2.0 (Late May to early July) | 2.0 (Late July to late August) | — | Early August to early October |

By consulting the numerical template, acquiring the numerical features of the crop harvesting time, the total crop fertilization amount and the crop fertilization time of the each of the grid units.

Numeralizations of the land use types and the topographic factors are the same as that in (2), and have no more detailed description.

S103, acquiring time information of a fertilization manual in the research area.

Based on the fertilization manuals of different administrative regions collected in S102, acquiring the time information of fertilization manuals of different administrative regions, for example: the time information of county 1 is in April-May, May-June and June-July, and the time information of county 2 is in May-June, July and August.

S104, calculating the fertilization influence numerical features of the each of the grid units by using weights of the fertilization influence features according to the time information of the fertilization manual in the research area, and acquiring the nitrogen fertilizer application amounts of the each of the grid units in different time periods;

the each of the grid units contains various numerical features characterizing the crop types, the total fertilizing amounts, the land use types, the topographic factors, the fertilization times and the like. By determining the weight of each feature, the nitrogen fertilizer application amount of the each of the grid units is calculated according to the weighted features, and specific formulas are as follows:

$$N_{UNIT} = N_{TA}(\omega_1 x_1 + \omega_2 x_2 + \ldots + \omega_i x_i) C_j \quad 3.1$$

$$N_{AMM} = N_{TA}(\varepsilon_1 x_1 + \varepsilon_2 x_2 + \ldots + \varepsilon_i x_i) C_j \quad 3.2$$

$$N_{NIT} = N_{TA}(\gamma_1 x_1 + \gamma_2 x_2 + \ldots + \gamma_i x_i) C_j \quad 3.3$$

Where $N_{UNIT}$ represents the nitrogen fertilizer application amount in the grid unit; $N_{AMM}$ represents an ammonia nitrogen amount in the grid unit; $N_{NIT}$ represents a nitrate nitrogen amount in the grid unit; $N_{TA}$ represents a total fertilizer application; $(x_1, x_2, \ldots, x_i)$ represents a set of digital features representing the land use types, the topographic factors, the fertilization times and other factors; $\omega$, $\varepsilon$, $\gamma$ represents weights of each feature; and $C_j$ represents a constant corresponding to the crop type in the cell.

In this embodiment, based on the time information of the fertilization manuals in different administrative regions obtained in S103, the fertilization influence numerical features of the each of the grid units are calculated by using the formulas of 3.1-3.3, and the nitrogen fertilizer application amounts of the each of the grid units in different time periods are obtained.

S105, performing a data processing on a first geographic information system to obtain a second geographic information system according to the nitrogen fertilizer application amounts of the each of the grid units in the different time periods.

Numbering the each of the grid units to obtain a numerical number of the each of the grid units, as shown in numerical numbers of "0105", "0208" and "0404" in Table 2; carrying out a one-to-one correspondence on the nitrogen fertilizer application amounts of the each of the grid units in different time periods and the numerical numbers of the grid units where the nitrogen fertilizer application amount is located to obtain electronic data of a fertilizer application manual, as shown in Table 2 and Table 3.

TABLE 2

Electronic template of regional fertilization manual

| | | Grid units | | | | | | | | | | | | | | |
|---|---|---|---|---|---|---|---|---|---|---|---|---|---|---|---|---|
| County | Time | 1 | 2 | 3 | 4 | 5 | 6 | 7 | 8 | 9 | 10 | 11 | 12 | 13 | 14 | 15 ... |
| 1 | April-May | 0105 | 0208 | 0301 | 0404 | 0509 | 0638 | | | | | | | | | |
| | May-June | 0105 | 0208 | 0303 | 0404 | 0509 | 0638 | | | | | | | | | |

TABLE 2-continued

Electronic template of regional fertilization manual

| County | Time | Grid units | | | | | | | | | | | | | | |
|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 ... |
| | June-July | 0105 | 0208 | 0303 | 0404 | 0509 | 0638 | | | | | | | | | |
| 2 | May-June | 0108 | 0208 | 0304 | 0404 | 0509 | 0638 | | | | | | | | | |
| | July | 0108 | 0208 | 0307 | 0404 | 0509 | 0638 | | | | | | | | | |
| | August | 0108 | 0208 | 0311 | 0404 | 0509 | 0638 | | | | | | | | | |
| 3 | March-April | 0115 | 0208 | 0323 | 0404 | 0509 | 0638 | | | | | | | | | |
| | May | 0115 | 0208 | 0323 | 0404 | 0509 | 0638 | | | | | | | | | |
| | July | 0115 | 0208 | 0323 | 0404 | 0509 | 0638 | | | | | | | | | |
| ... | | | | | | | | | | | | | | | | |

Table 3 is examples of the nitrogen fertilization amounts represented by different numerical numbers. Each numerical number in this table represents the fertilization time and the fertilization amount of a grid in the administrative region.

TABLE 3

Examples of the nitrogen fertilization amounts represented by different numerical numbers (Unit: kg/ha)

| Values of grid unit | Ammonia nitrogen content | Nitrate nitrogen content | Total nitrogen content |
|---|---|---|---|
| 0509 | 3.4 | 2.0 | 5.9 |
| 0638 | 2.3 | 1.5 | 4.4 |

According to Table 2 and Table 3, inputting the electronic data of fertilization manual into the first geographic information system to obtain the second geographic information system.

The first geographic information system of this embodiment refers to the geographic information system without electronic data input of fertilization manual, and the second geographic information system refers to the geographic information system that has completed electronic data input of fertilization manual.

S106, using the second geographic information system to estimate the nitrogen application amount in the research area.

The second geographic information system may show spatial and temporal distributions of the nitrogen fertilizer application amount in different administrative regions, that is, may realize the nitrogen fertilizer application amount estimation in the research area.

In this embodiment, the nitrogen fertilizer application amounts in the grid units in the different administrative regions in the different time periods (electronic data of fertilization manual) is input into the geographic information system (GIS), comprehensively reflects time and space distributions of the regional nitrogen fertilizer application amount, and provides the scientific basis for fine management of soil fertilization.

It should be noted that although the method operations of the above embodiments are described in the drawings in a specific order, this does not require or imply that these operations must be performed in this specific order, or that all the illustrated operations must be performed to achieve the desired results. On the contrary, the depicted steps may change the execution order. Additionally or alternatively, some steps may be omitted, multiple steps may be combined into one step for execution, and/or one step may be decomposed into multiple steps for execution.

Embodiment 2

Figure 4:
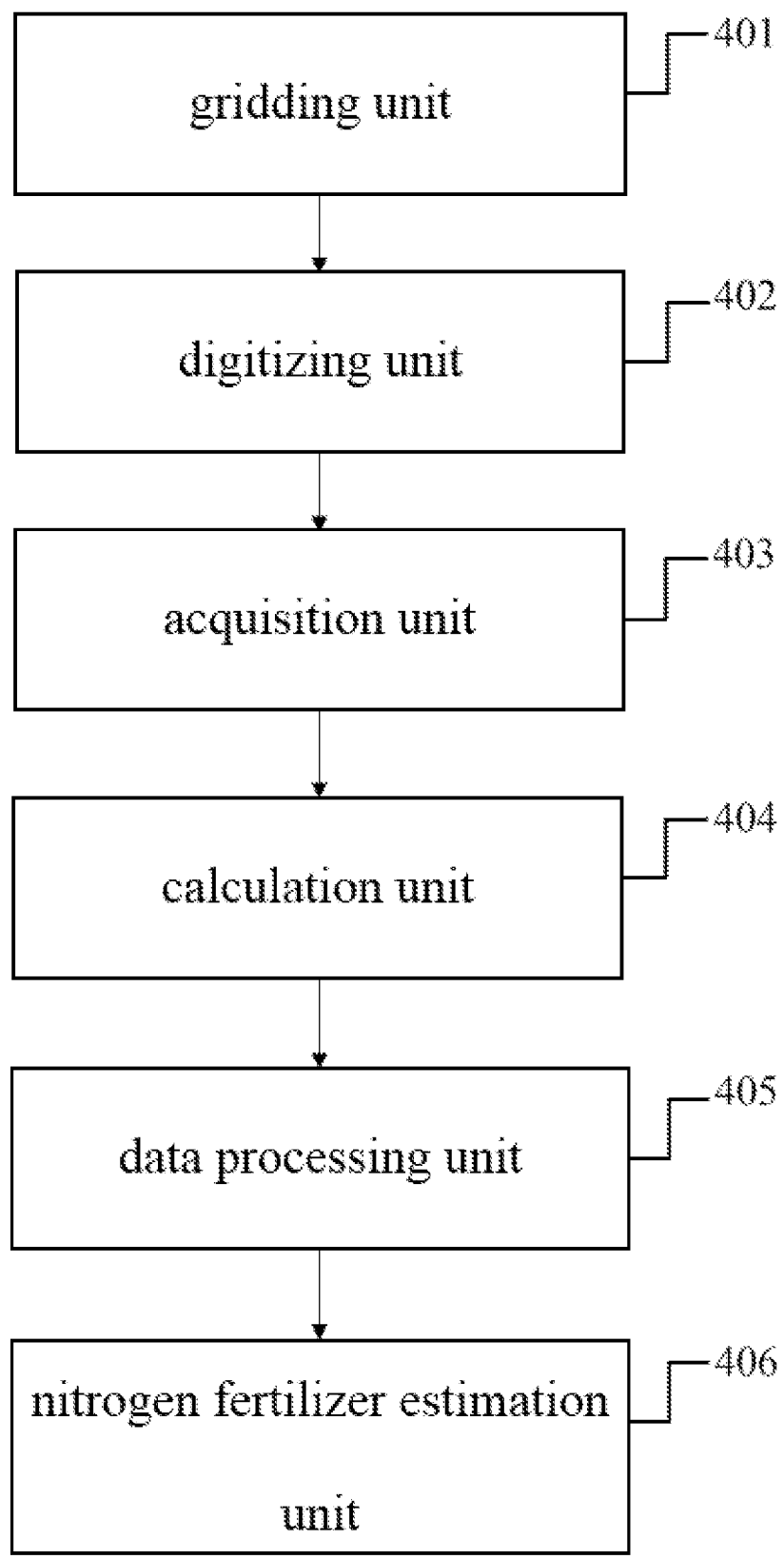
FIG. 4 is a flowchart of a system for estimating a nitrogen application amount in distributive regions according to Embodiment 2 of the application.

As shown in FIG. 4, this embodiment provides a system for estimating a nitrogen application amount in distributive regions, the system includes a gridding unit 401, a digitizing unit 402, an acquisition unit 403, a calculation unit 404, a data processing unit 405 and a nitrogen fertilizer estimation unit 406. Specific functions of each unit are as follows:

the gridding unit 401 is used for carrying out the gridding processing on the research area to obtain a plurality of gridding units;

a digitizing unit 402 is used for carrying out a numerical processing on fertilization influence features of each of the grid units to obtain fertilization influence numerical features of the each of the grid units, the fertilization influence features include the crop types, the land use types, the topographic factors, the crop harvesting times, the crop fertilization total amounts and the crop fertilization times;

the acquisition unit 403 is used for acquiring the time information of the fertilization manual in the research area;

the calculation unit 404 is used for calculating the fertilization influence numerical features of the each of the grid units by using weights of the fertilization influence features according to the time information of the fertilization manual in the research area, and acquiring the nitrogen fertilizer application amounts of the each of the grid units in different time periods;

the data processing unit 405 is used for performing a data processing on a first geographic information system to obtain a second geographic information system according to the nitrogen fertilizer application amounts of the each of the grid units in the different time periods; and a nitrogen fertilizer estimation unit 406 is used for using the second geographic information system to estimate the nitrogen fertilizer application amount in the research area.

Embodiment 3

Figure 5:
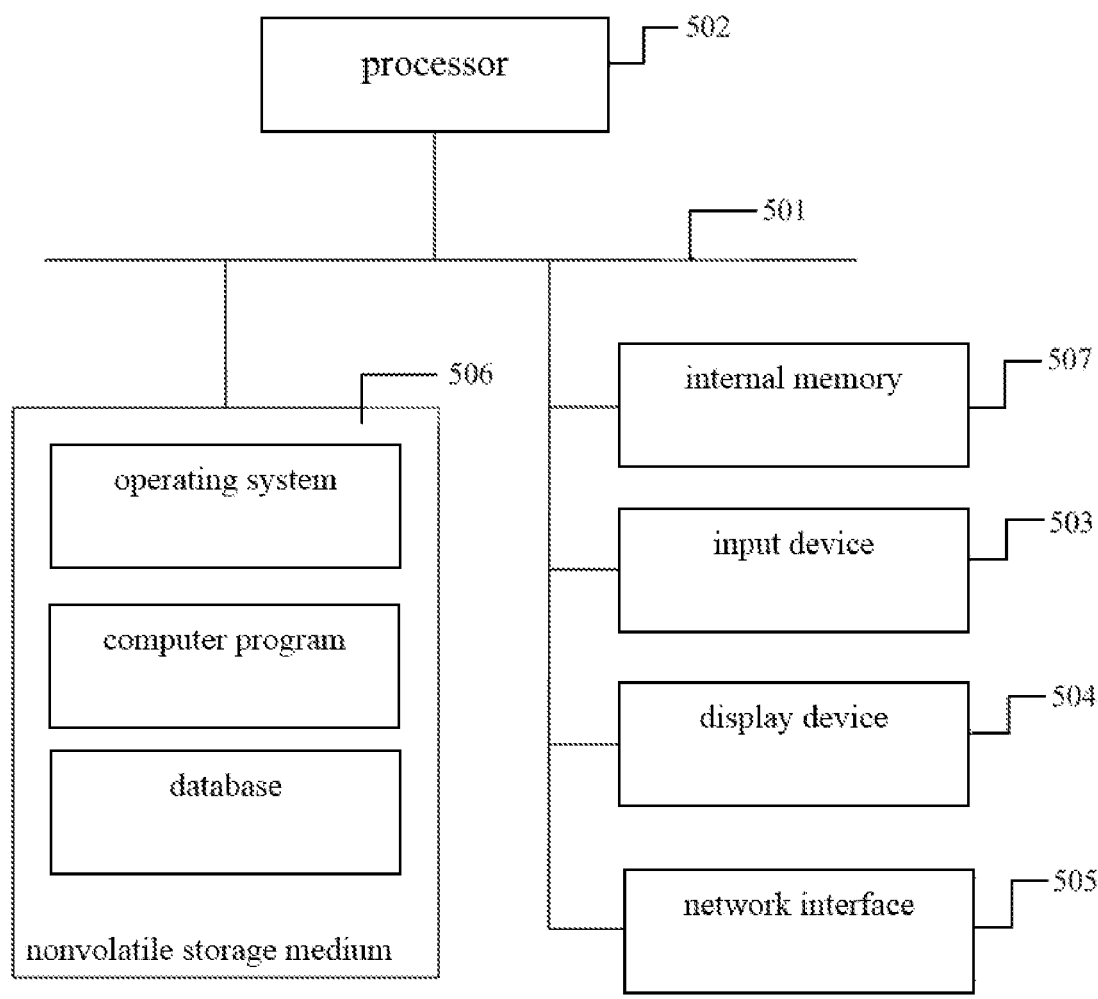
FIG. 5 is a structural block diagram of a computer equipment according to Embodiment 3 of the application.

As shown in FIG. 5, this embodiment provides a computer equipment, e computer equipment includes a processor 502, a memory, an input device 503, a display device 504 and a network interface 505 connected through a system bus

501. The processor is used for providing computing and control capabilities, and the memory includes a nonvolatile storage medium 506 and an internal memory 507. The nonvolatile storage medium 506 stores an operating system, a computer program and a database. The internal memory 507 provides an environment for the operation of the operating system and computer programs in the nonvolatile storage medium. When the processor 502 executes the computer programs stored in the memory, the method for estimating a nitrogen application amount in distributive regions in Embodiment 1 described above is realized as follows:

carrying out the gridding processing on the research area to obtain a plurality of grid units;

carrying out the numerical processing on the fertilization influence features of each of the grid units to obtain the fertilization influence numerical features of the each of the grid units, where the fertilization influence numerical features include the crop types, the land use types, the topographic factors, the crop harvesting times, the crop fertilization total amounts and the crop fertilization times;

acquiring the time information of the fertilization manual in the research area;

calculating the fertilization influence numerical features of the each of the grid units by using weights of the fertilization influence features according to the time information of the fertilization manual in the research area, and acquiring the nitrogen fertilizer application amounts of the each of the grid units in different time periods;

performing a data processing on a first geographic information system to obtain a second geographic information system according to the nitrogen fertilizer application amounts of the each of the grid units in the different time periods; and using the second geographic information system to estimate the nitrogen fertilizer application amount in the research area.

Embodiment 4

This embodiment provides a storage medium, the storage medium is a computer-readable storage medium and stores a computer program. When the computer program is executed by a processor, the method for estimating a nitrogen application amount in distributive regions in Embodiment 1 above is realized as follows:

carrying out the gridding processing on the research area to obtain a plurality of grid units;

carrying out a numerical processing on fertilization influence features of each of the grid units to obtain fertilization influence numerical features of the each of the grid units, where the fertilization influence numerical features include crop types, land use types, topographic factors, crop harvesting times, crop fertilization total amounts and crop fertilization times;

acquiring the time information of the fertilization manual in the research area;

calculating the fertilization influence numerical features of the each of the grid units by using weights of the fertilization influence features according to the time information of the fertilization manual in the research area, and acquiring the nitrogen fertilizer application amounts of the each of the grid units in different time periods;

performing a data processing on a first geographic information system to obtain a second geographic information system according to the nitrogen fertilizer application amounts of the each of the grid units in the different time periods; and using the second geographic information system to estimate the nitrogen fertilizer application amount in the research area.

It should be noted that the computer-readable storage medium of this embodiment may be a computer-readable signal medium or a computer-readable storage medium or any combination of the two. The computer-readable storage medium may be, for example, but not limited to, an electrical, magnetic, optical, electromagnetic, infrared, or semiconductor system, equipment or device, or any combination of the above. More specific examples of computer-readable storage media may include, but are not limited to, an electrical connection with one or more wires, a portable computer disk, a hard disk, a random access memory (RAM), a read-only memory (ROM), an erasable programmable read-only memory (EPROM or flash memory), an optical fiber, a portable compact disk read-only memory (CD-ROM), an optical storage device, a magnetic storage device, or any suitable combination of the above.

In this embodiment, the computer-readable storage medium may be any tangible medium containing or storing a program, which may be used by or in combination with an instruction execution system, equipment or device. In this embodiment, the computer-readable signal medium may include a data signal propagated in baseband or as a part of a carrier wave, in which a computer-readable program is carried. This propagated data signal may take many forms, including but not limited to electromagnetic signals, optical signals or any suitable combination of the above. The computer-readable signal medium may also be any computer-readable storage medium other than the computer-readable storage medium, which may send, propagate or transmit the program for use by or in connection with the instruction execution system, apparatus or device. The computer program contained in the computer-readable storage medium may be transmitted by any suitable medium, including but not limited to: wires, optical cables, RF (radio frequency) and the like, or any suitable combination of the above.

The computer-readable storage medium may be used to write a computer program for executing this embodiment in one or more programming languages or their combinations, including object-oriented programming languages, such as Java, Python and C++, and conventional procedural programming languages, such as C language or similar programming languages. The program may be executed entirely on the user's computer, partially on the user's computer, as an independent software package, partially on the user's computer and partially on a remote computer, or completely on a remote computer or server. In the case involving a remote computer, the remote computer may be connected to a user computer through any kind of network, including a local area network (LAN) or a wide area network (WAN), or may be connected to an external computer (for example, through the Internet using an Internet service provider).

To sum up, in the application, the fertilization influence features of the each of the grid units are numerically processed, and then the digitized fertilization influence features are calculated by using each feature weight, so that the estimation of nitrogen fertilizer application amount in different spaces is realized; in addition, the application also considers the time specificity of the nitrogen fertilizer application, calculates the nitrogen fertilizer consumption of the same grid unit in different time periods according to the time information in the fertilization manual of the research area, inputs the nitrogen fertilizer consumption of the each of the grid units in different administrative areas in different time periods into a geographic information system (GIS), and reflects the distribution of the regional nitrogen fertilizer consumption in time and space by using the geographic information system (GIS), thus providing a scientific basis for the fine management of soil fertilization.

The above is only the preferred embodiment of the application, but the scope of protection of the patent of the application is not limited to this. Any person familiar with the technical field within the scope disclosed in the patent of the application may replace or change it equally according to the technical scheme and inventive concept of the application, which belongs to the scope of protection of the application.

What is claimed is:

1. A method for estimating a nitrogen application amount in distributive regions, comprising:
    carrying out a gridding processing on a research area to obtain a plurality of grid units;
    carrying out a numerical processing on fertilization influence features of each of the grid units to obtain fertilization influence numerical features of the each of the grid units, the fertilization influence numerical features comprise crop types, land use types, topographic factors, crop harvesting times, total crop fertilization amounts and crop fertilization times;
    acquiring time information of a fertilization manual in the research area;
    calculating the fertilization influence numerical features of the each of the grid units by using weights of the fertilization influence features according to the time information of the fertilization manual in the research area, and acquiring the nitrogen fertilizer application amount of the each of the grid units in different time periods;
    performing a data processing on a first geographic information system to obtain a second geographic information system according to the nitrogen fertilizer application amount of the each of the grid units in the different time periods; and
    using the second geographic information system to estimate the nitrogen application amount in the research area;
    wherein the carrying out the numerical processing on the fertilization influence features of the each of the grid units specifically comprises:
    carrying out the numerical processing on the crop types of the each of the grid units; and
    carrying out the numerical processing on the crop harvesting times, the total crop fertilization amounts and the crop fertilization times in the each of the grid units;
    wherein the carrying out the numerical processing on the crop types of the each of the grid units specifically comprises:
    establishing a block containing only one crop representation type in the each of the grid units, and using blocks containing different crop representation types of the plurality of grid units to represent the crops planted in the each of the grid units; and
    establishing a mapping relationship between the crops planted in the each of the grid units and constants, and completing the numerical processing on the crop types; and establishing an m×n matrix by using an R language for an area containing m counties, in which the county with the most planting areas has n planting areas when making a regional fertilization electronic manual according to the mapping relationship between the crops planted in the each of the grid units and the constants, wherein a matrix element $x_{i,j}$ represents a j-th planting area of an i-th county, and a numerical value $C_x$ of $x_{i,j}$ represents a crop type of the area;
    wherein calculating the fertilization influence numerical features of the each of the grid units by using the weights of the fertilization influence features, and calculation formulas are as follows:

$$N_{UNIT}=N_{TA}(\omega_x x_1+\omega_2 x_2+ \ldots +\omega_i x_i)C_j$$

$$N_{AMM}=N_{TA}(\varepsilon_1 x_1+\varepsilon_2 x_2+ \ldots +\varepsilon_i x_i)C_j$$

$$N_{NIT}=N_{TA}(\gamma_1 x_1+\gamma_2 x_2+ \ldots +\gamma_i x_i)C_j;$$

wherein $N_{UNIT}$ represents the nitrogen fertilizer application amount in the grid unit; $N_{AMM}$ represents an ammonia nitrogen amount in the grid unit; $N_{NIT}$ represents a nitrate nitrogen amount in the grid unit; $N_{TA}$ represents a total fertilizer application; $(X_1, X_2, \ldots, x_i)$ represents a set of fertilization influence numerical features comprising the land use types, the topographic factors, the fertilization times; $\omega$, $\varepsilon$, $\gamma$ represents weights of each fertilization influence numerical feature; and $C_j$ represents a constant corresponding to the crop type in a cell;
    wherein performing the data processing on the first geographic information system to obtain the second geographic information system according to the nitrogen fertilizer application amount of the each of the grid units in the different time periods, specifically as follows:
    numbering the each of the grid units to obtain a numerical number of the each of the grid units;
    carrying out a one-to-one correspondence between the nitrogen fertilizer application amounts of the each of the grid units in the different time periods and the numerical numbers of the each of the grid units where the nitrogen fertilizer application amount is located to obtain electronic data of the fertilization manual; and
    inputting the electronic data of the fertilization manual into the first geographic information system to obtain the second geographic information system.

2. The method for estimating a nitrogen application amount in distributive regions according to claim 1, wherein the carrying out the numerical processing on the crop harvesting times, the total crop fertilization amounts and the crop fertilization times in the each of the grid units specifically comprises:
    collecting fertilization manuals of different administrative regions, sorting out a numerical template that integrates the crop harvesting times, the total crop fertilization amounts and the crop fertilization times; and
    by consulting the numerical template, acquiring the numerical features of the crop harvesting time, the total crop fertilization amount and the crop fertilization time of the each of the grid units.

3. The method for estimating a nitrogen application amount in distributive regions according to claim 1, wherein the electronic data of the fertilization manual comprises the numerical numbers of the grid units, administrative area information and time information, wherein the numerical numbers of the grid units represents the nitrogen fertilizer application amounts of the grid units.

4. A system for estimating a nitrogen application amount in distributive regions, comprising:
a gridding unit configured for carrying out a gridding processing on a research area to obtain a plurality of grid units;
a digitizing unit configured for carrying out a numerical processing on fertilization influence features of each of the grid units to obtain fertilization influence numerical features of the each of the grid units, the fertilization influence features comprise crop types, land use types, topographic factors, crop harvesting times, total crop fertilization amounts and crop fertilization times; wherein the carrying out the numerical processing on the fertilization influence features of the each of the grid units specifically comprises: carrying out the numerical processing on the crop types of the each of the grid units; and carrying out the numerical processing on the crop harvesting times, the total crop fertilization amounts and the crop fertilization times in the each of the grid units; wherein the carrying out the numerical processing on the crop types of the each of the grid units specifically comprises: establishing a block containing only one crop representation type in the each of the grid units, and using blocks containing different crop representation types of the plurality of grid units to represent the crops planted in the each of the grid units; and establishing a mapping relationship between the crops planted in the each of the grid units and constants, and completing the numerical processing on the crop types; and establishing an m×n matrix by using an R language for an area containing m counties, in which the county with the most planting areas has n planting areas when making a regional fertilization electronic manual according to the mapping relationship between the crops planted in the each of the grid units and the constants, wherein a matrix element $x_{i,j}$ represents a j-th planting area of an i-th county, and a numerical value $C_x$ of $x_{i,j}$ represents a crop type of the area;
an acquisition unit configured for acquiring time information of a fertilization manual in the research area;
a calculation unit configured for calculating the fertilization influence numerical features of the each of the grid units by using weights of the fertilization influence features according to the time information of the fertilization manual in the research area, and acquiring the nitrogen fertilizer application amounts of the each of the grid units in different time periods; wherein calculating the fertilization influence numerical features of the each of the grid units by using the weights of the fertilization influence features, and calculation formulas are as follows:

$$N_{UNIT}=N_{TA}(\omega_x x_1+\omega_2 x_2+ \ldots +\omega_i x_i)C_j$$

$$N_{AMM}=N_{TA}(\varepsilon_1 x_1+\varepsilon_2 x_2+ \ldots +\varepsilon_i x_i)C_j$$

$$N_{NIT}=N_{TA}(\gamma_1 x_1+\gamma_2 x_2+ \ldots +\gamma_i x_i)C_j;$$

wherein $N_{UNIT}$ represents the nitrogen fertilizer application amount in the grid unit; $N_{AMM}$ represents an ammonia nitrogen amount in the grid unit; $N_{NIT}$ represents a nitrate nitrogen amount in the grid unit; $N_{TA}$ represents a total fertilizer application; $(X_1, X_2, \ldots, x_i)$ represents a set of fertilization influence numerical features comprising the land use types, the topographic factors, the fertilization times; $\omega$, $\varepsilon$, $\gamma$ represents weights of each fertilization influence numerical feature; and $C_j$ represents a constant corresponding to the crop type in a cell;

a data processing unit configured for performing a data processing on a first geographic information system to obtain a second geographic information system according to the nitrogen fertilizer application amounts of the each of the grid units in the different time periods; wherein performing the data processing on the first geographic information system to obtain the second geographic information system according to the nitrogen fertilizer application amount of the each of the grid units in the different time periods, specifically as follows: numbering the each of the grid units to obtain a numerical number of the each of the grid units; carrying out a one-to-one correspondence between the nitrogen fertilizer application amounts of the each of the grid units in the different time periods and the numerical numbers of the each of the grid units where the nitrogen fertilizer application amount is located to obtain electronic data of the fertilization manual; and inputting the electronic data of the fertilization manual into the first geographic information system to obtain the second geographic information system; and a nitrogen fertilizer estimation unit configured for using the second geographic information system to estimate a nitrogen fertilizer application amount in the research area.

5. A computer equipment, comprising a processor and a memory for storing a program executable by the processor, wherein when the processor executes the program stored in the memory, the method for estimating a nitrogen application amount in distributive regions according to claim 1 is realized.

* * * * *